United States Patent
Todd et al.

(12) United States Patent (10) Patent No.: US 7,029,995 B2
(45) Date of Patent: Apr. 18, 2006

(54) METHODS FOR DEPOSITING AMORPHOUS MATERIALS AND USING THEM AS TEMPLATES FOR EPITAXIAL FILMS BY SOLID PHASE EPITAXY

(75) Inventors: Michael A. Todd, Phoenix, AZ (US); Paul D. Brabant, Phoenix, AZ (US); Keith D. Weeks, Mesa, AZ (US); Jianqing Wen, Singapore (SG)

(73) Assignee: ASM America, Inc., Phoenix, AZ (US)

( * ) Notice: Subject to any disclaimer, the term of this patent is extended or adjusted under 35 U.S.C. 154(b) by 115 days.

(21) Appl. No.: 10/871,687

(22) Filed: Jun. 9, 2004

(65) Prior Publication Data

US 2005/0026400 A1    Feb. 3, 2005

Related U.S. Application Data

(60) Provisional application No. 60/478,217, filed on Jun. 13, 2003.

(51) Int. Cl.
*H01L 21/20* (2006.01)

(52) U.S. Cl. .................. 438/481; 438/486; 438/404

(58) Field of Classification Search .......... 438/481, 438/166, 404, 479, 486, 487; 257/49, 65, 257/70, 75
See application file for complete search history.

(56) References Cited

U.S. PATENT DOCUMENTS

| | | | |
|---|---|---|---|
| 5,219,767 A | 6/1993 | Kohno | |
| 5,605,860 A | 2/1997 | Kawasaki et al. | |
| 6,274,463 B1 | 8/2001 | Chaiken | |
| 6,346,732 B1 | 2/2002 | Mizushima et al. | |
| 6,395,621 B1 | 5/2002 | Mizushima et al. | |
| 6,555,439 B1 | 4/2003 | Xiang et al. | |
| 6,689,671 B1 | 2/2004 | Yu et al. | |
| 6,774,015 B1 * | 8/2004 | Cohen et al. | 438/486 |
| 2002/0132455 A1 | 9/2002 | Muramatsu et al. | |
| 2004/0221792 A1 * | 11/2004 | Forbes | 438/94 |

* cited by examiner

*Primary Examiner*—Kevin M. Picardat
(74) *Attorney, Agent, or Firm*—Knobbe Martens Olson & Bear LLP

(57) ABSTRACT

Methods for forming epitaxial films involve forming a buffer layer on a single crystal substrate, depositing an amorphous layer on the buffer layer, then forming an epitaxial film from the amorphous layer by solid phase epitaxy.

36 Claims, 2 Drawing Sheets

US 7,029,995 B2

METHODS FOR DEPOSITING AMORPHOUS MATERIALS AND USING THEM AS TEMPLATES FOR EPITAXIAL FILMS BY SOLID PHASE EPITAXY

RELATED APPLICATION INFORMATION

This application claims priority to U.S. Provisional Patent Application No. 60/478,217, filed Jun. 13, 2003, which is hereby incorporated by reference in its entirety.

BACKGROUND OF THE INVENTION

1. Field of the Invention

This invention relates to methods for forming epitaxial films in various manufacturing process, such as in semiconductor manufacturing. More particularly, this invention relates to methods for depositing amorphous layers on single crystal substrates, then forming epitaxial films from the amorphous layers by solid phase epitaxy.

2. Description of the Related Art

Various semiconductor manufacturing processes require the formation of an epitaxial layer on an underlying single crystal substrate. In some cases, the epitaxial layer may be formed by direct deposition on the single crystal substrate, e.g., by chemical vapor deposition. However, in other cases, direct deposition is difficult.

Solid phase epitaxy is an alternate method to direct deposition for forming epitaxial films. Solid phase epitaxy involves the crystallization of an amorphous film to form an epitaxial film having a crystal structure patterned on the single crystal structure beneath it. Solid phase epitaxy is generally conducted by forming an amorphous film on a single crystal substrate, then crystallizing the amorphous film to form the epitaxial film. However, in many cases it is difficult to form the amorphous film on the single crystal substrate.

SUMMARY OF THE INVENTION

A preferred embodiment provides a method for making an epitaxial film, comprising:
providing a single crystal substrate;
forming an amorphous buffer layer on the single crystal substrate, the amorphous buffer layer comprising an element selected from the group consisting of boron, nitrogen, chlorine, fluorine, indium, phosphorous, arsenic and antimony;
depositing an amorphous silicon-containing layer on the amorphous buffer layer; and
crystallizing the amorphous silicon-containing layer to thereby form an epitaxial film.

Another preferred embodiment provides a method for making an epitaxial film, comprising:
providing a single crystal substrate;
oxidizing a surface of the single crystal substrate to form a surface oxide;
reducing a portion of the surface oxide to form an oxide buffer layer;
depositing an amorphous silicon-containing layer on the oxide buffer layer; and
crystallizing the amorphous silicon-containing layer to thereby form an epitaxial film.

These and other embodiments are described in greater detail below.

BRIEF DESCRIPTION OF THE DRAWINGS

These and other aspects of the invention will be readily apparent from the following description and from the appended drawings (not to scale), which are meant to illustrate and not to limit the invention, and wherein.

DETAILED DESCRIPTION OF THE PREFERRED EMBODIMENT

Figure 1:
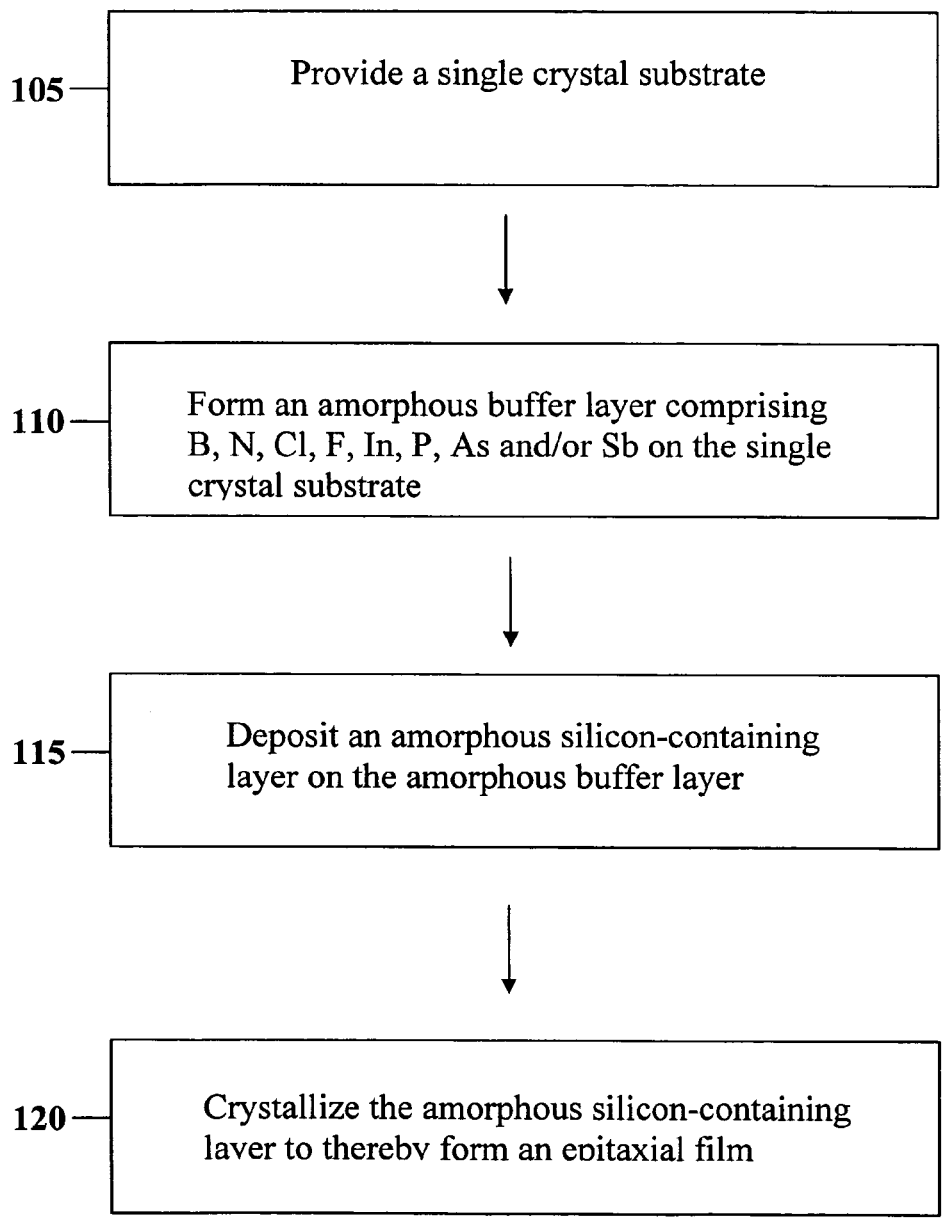
FIG. 1 shows a flow chart for a preferred embodiment of a method for making an epitaxial film.

This invention provides a number of embodiments involving methods for making epitaxial films. These embodiments generally involve providing a single crystal substrate; forming a buffer layer on the single crystal substrate; depositing an amorphous layer on the buffer layer; and crystallizing the amorphous layer to form the epitaxial film. Various specific embodiments are discussed below for the purpose of illustrating the invention. It will be understood by those skilled in the art that various details discussed below with respect to the practice of a particular embodiment are generally applicable to other embodiments and to the invention in general, unless otherwise stated.

The single crystal substrate is preferably a silicon- and/or germanium-containing or germanium single crystal substrate, although the methods described herein are also applicable to other substrates. The single crystal substrate is preferably provided with a surface suitably prepared for epitaxial deposition. Methods for cleaning residues and/or oxides from various single crystal substrates are known to those skilled in the art. For example, a silicon single crystal substrate is preferably wet cleaned using sulfuric acid/ hydrogen peroxide, SC1 and SC2 cleans, subjected to an HF-last etch to remove oxide, and baked in a hydrogen environment, in a manner known to those skilled in the art of semiconductor manufacturing.

Various methods may be used to form the buffer layer on the single crystal substrate. In a preferred embodiment, illustrated in FIG. 1, a single crystal substrate is provided at step 105 and a buffer layer comprising an element selected from the group consisting of boron, nitrogen, chlorine, fluorine, indium, phosphorous, arsenic and antimony is formed at step 110 on the single crystal substrate. Preferably, the forming of the buffer layer on the single crystal substrate at step 110 is carried out by depositing one or more of the elements onto the single crystal substrate. Such deposition can be accomplished in various ways, e.g., by ion bombardment, molecular beam epitaxy, and chemical vapor deposition. Thermal chemical vapor deposition and plasma-enhanced chemical vapor deposition are preferred. Those skilled in the art will understand that forming of the buffer layer on the single crystal substrate at step 110 by chemical vapor deposition may involve depositing the element onto the substrate surface to form a discrete buffer layer which may be chemically bonded to the surface, and/or modifying the substrate surface by chemical reaction with the element or precursor thereof to form the buffer layer.

Chemical vapor deposition (CVD) is preferably carried out in a suitable chamber. Examples of suitable thermal CVD chambers include batch furnaces and single wafer reactors. An example of a preferred chamber is a single-wafer, horizontal gas flow reactor, preferably radiatively heated. Suitable reactors of this type are commercially available, and preferred models include the Epsilon™ series of single wafer epitaxial reactors commercially available from ASM America, Inc. of Phoenix, Ariz. While the processes described herein can also be employed in alternative reactors, such as a showerhead arrangement, benefits in increased uniformity and deposition rates have been found particularly effective in the horizontal, single-pass, laminar gas flow arrangement of the Epsilon™ chambers. A suitable manifold may be used to supply the element, precursor thereof, and/or other elemental sources (as described elsewhere herein) to the thermal chemical vapor deposition chamber in which the deposition is preferably conducted. Thermal CVD is preferably conducted at a temperature in the range of about 400° C. to about 600° C., more preferably in the range of about 450° C. to about 550° C., even more preferably in the range of about 450° C. to about 500° C. Suitable chambers for conducting plasma-enhanced chemical vapor deposition (PECVD) are also commercially available, and preferred models include the Eagle™ series of reactors commercially available from ASM Japan K.K., Tokyo, Japan. Plasma CVD is preferably conducted at a temperature in the range of about 50° C. to about 400° C.

The element or precursor thereof may be supplied to the reactor alone or in admixture with another element or elemental source. For example, phosphorous, arsenic and antimony are preferably supplied in the form of precursors such as phosphine, trisilylphosphine, arsine, trisilylarsine, and stibine. The elements chlorine and fluorine are preferably supplied in the form of precursors such as diatomic chlorine and fluorine, respectively, and/or halogenated silanes such as $SiCl_4$ and/or $SiF_4$, respectively. PECVD is preferably used to form chlorine and fluorine when using halogenated silane precursors. The element antimony is preferably supplied in the form of an antimony precursor such as stibine or silylstibine. The element nitrogen is preferably supplied in the form of atomic nitrogen (e.g., generated from diatomic nitrogen by remote plasma), or in the form of a precursor such as trisilylamine and/or tetrasilylhydrazine. The element or precursor thereof is preferably supplied in a flow of ultra-high purity carrier gas, e.g., $H_2$, $N_2$, He or Ar, optionally in admixture or concurrently with an elemental source selected from the group consisting of silicon source, germanium source and carbon source. Examples of silicon sources include silane, disilane, and trisilane, preferably trisilane. Examples of germanium sources include germane and digermane. Examples of carbon sources include alkanes (e.g., methane, ethane, propane, etc.), alkenes (ethylene, propylene, etc.), and carbon sources that are sources of other elements as well, such as methylsilanes and silylmethanes.

Boron is preferably supplied in the form of a boron source, e.g., a boron hydride (i.e. a borane) precursor such as diborane or decaborane or a boron halide precursor such as boron trichloride or boron trifluoride. The boron source is preferably supplied in a carrier gas and may be supplied in admixture or concurrently with another element or elemental source as described above. Preferably, the boron source is supplied alone in a flow of ultra-high purity carrier gas such as hydrogen, nitrogen, helium or argon, (preferably hydrogen). In a preferred embodiment, the buffer layer consists essentially of boron and/or silicon-boron compounds, preferably compounds that are not pseudomorphic with regard to the single crystal substrate.

Figure 2:
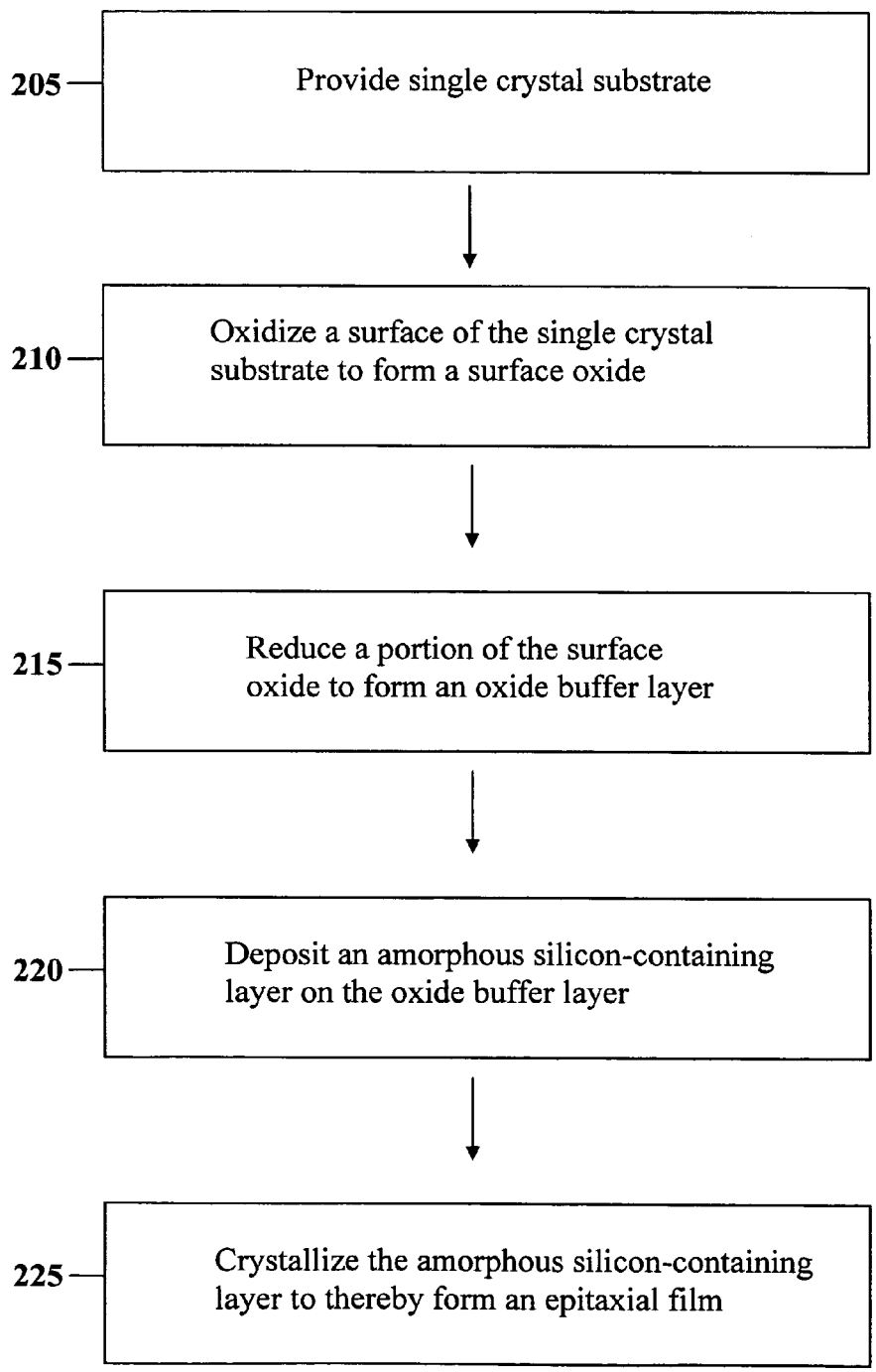
FIG. 2 shows a flow chart for an alternate embodiment of a method for making an epitaxial film.
Figure 1:
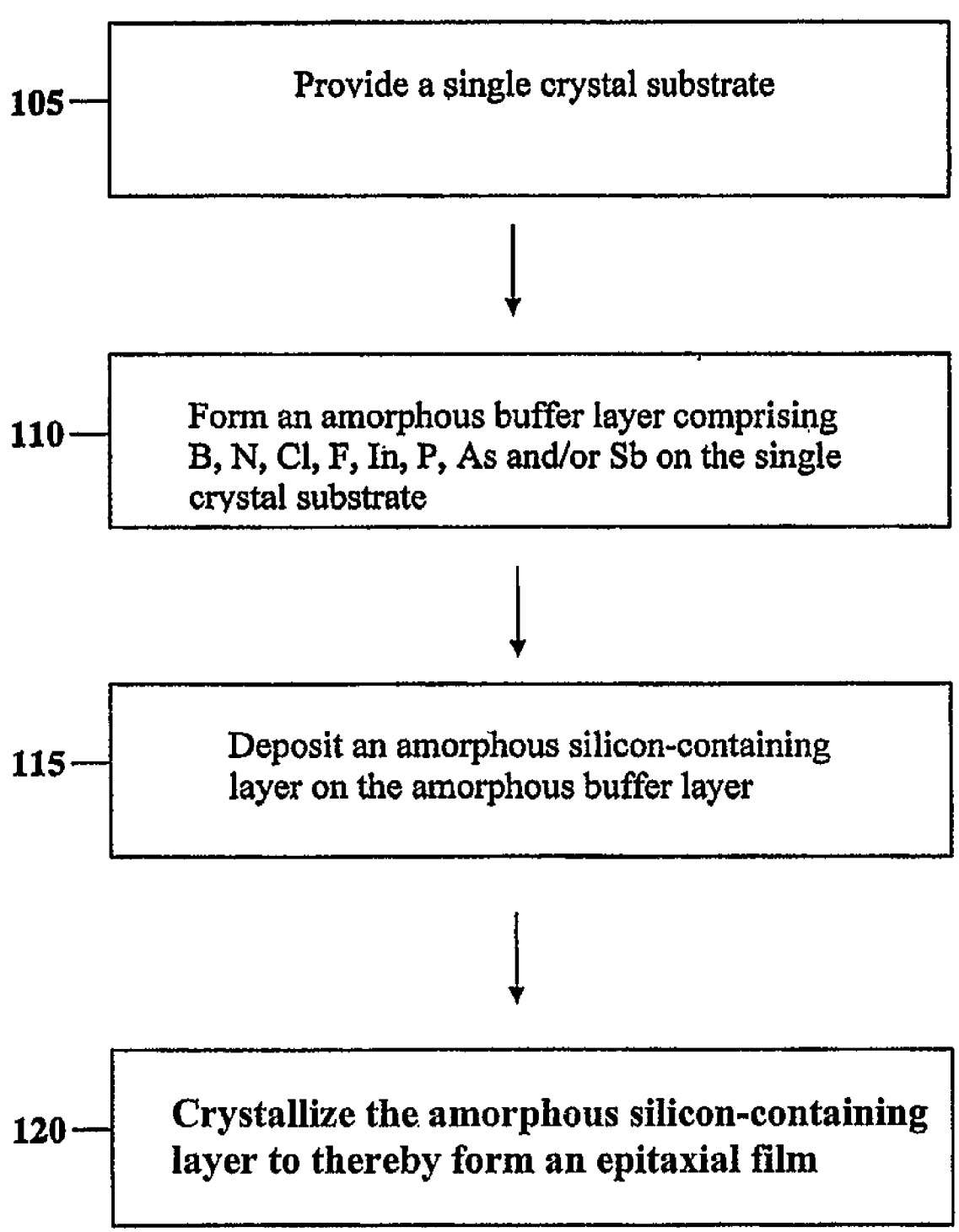

In another embodiment, illustrated in FIG. 2, a single crystal substrate is provided at step 205 and a buffer layer is formed by first oxidizing the single crystal substrate at step 210 to form a surface oxide, then chemically reducing a portion of the oxide at step 215 to form an oxide buffer layer. Preferably, the surface oxide formed at step 210 is thicker than one monolayer, and the chemical reduction of the oxide at step 215 is preferably carried out under conditions effective to result in an oxide buffer layer having a thickness of several monolayers, more preferably about one monolayer. Chemical reduction of the oxide at step 215 is preferably carried out by baking the wafer under hydrogen, preferably at a temperature of about 700° C. or greater, more preferably at a temperature in the range of about 700° C. to about 950° C., most preferably about 850° C. to about 930° C., for a period of time effective to produce an oxide buffer layer having the desired thickness and/or surface concentration. Preferably, the oxide buffer layer is amorphous. In a preferred embodiment, the substrate is single crystal Si and the oxide buffer layer is silicon oxide.

Whether produced by the embodiment illustrated in FIG. 1 or FIG. 2, the buffer layer is preferably relatively thin, more preferably about one to several monolayers in thickness, although in some cases the buffer layer may be less than a single monolayer. The surface concentration of the buffer layer may be expressed in terms of the amount of buffer layer material on the substrate, and is preferably in the range of about $4e^{14}$ to about $2e^{15}$ atoms of buffer layer material per square centimeter ($cm^2$) of substrate surface. Preferably, the buffer layer material is substantially uniformly distributed across the surface, and often the average thickness of the buffer layer is in the range of about 3 Å to about 25 Å, more preferably about 5 Å to about 15 Å.

Preferably, the buffer layer is amorphous, so as to facilitate subsequent deposition of an amorphous layer on the buffer layer. When produced by the embodiment illustrated in FIG. 1, the amount of the element or precursor thereof used in forming the buffer layer is preferably effective to render the buffer layer amorphous, and thus is higher than the amounts typically used for electrical doping. For example, when supplied in admixture with an elemental source (e.g., a silicon source) capable of forming a crystalline layer, an element and/or a precursor of an element selected from the group consisting of boron, nitrogen, chlorine, fluorine, indium, phosphorous, arsenic and antimony is preferably provided in an amount effective to disrupt the crystalline lattice, thereby forming an amorphous buffer layer. Preferably, the amount of the crystal-disrupting element in the resulting buffer layer is greater than about 1 atomic percent, more preferably greater than about 5 atomic percent, even more preferably greater than about 25 atomic percent. The amount of the crystal-disrupting element may vary over a broad range, and may be up to about 100 atomic percent for elements that form amorphous layers when deposited onto the single crystal substrate. Buffer layers comprising the elements boron, phosphorus, indium and/or arsenic are preferably formed by depositing a discrete layer containing one or more of these elements onto the single crystal substrate using CVD at a temperature in the range of about 450° C. to about 500° C. The deposited buffer layer may be chemically bonded to the substrate, but chemical bonding is not required. Buffer layers comprising the elements oxygen, chlorine, fluorine and/or nitrogen are preferably formed by introducing the element or precursor thereof to a CVD chamber containing the single crystal substrate and chemically reacting the element or precursor thereof with the substrate at a temperature in the range of about 450° C. to about 500° C., thereby forming a buffer layer on the substrate surface that preferably comprises atoms of the element and substrate silicon atoms.

The amorphous layer deposited onto the buffer layer is preferably a silicon-containing layer that is useful in semiconductor manufacturing and that is capable of crystallization. Examples of suitable silicon-containing layers include silicon, germanium, silicon germanium, and alloys of these materials with carbon. Those skilled in the art will understand that terms such as "silicon," "silicon germanium," "Si," and "SiGe," are terms of art used to show that the material comprises the indicated elements, and are not to be construed as limiting the relative proportions of those elements nor as excluding the presence of other elements. Thus, for example, a "SiGe" film may contain Si and Ge in various proportions and may contain other elements as well, e.g., electrically active dopants such as antimony, boron, arsenic and phosphorous. For the embodiments illustrated in FIGS. 1 and 2, the deposition of the amorphous layer onto the buffer layer at steps 115 and 220 may be carried out in a similar fashion, and thus the following discussion is applicable to both embodiments.

The amorphous layer is preferably deposited onto the buffer layer by chemical vapor deposition, e.g., thermal chemical vapor deposition or plasma-enhanced chemical vapor deposition using a source or sources of the elements desired in the amorphous layer. Chemical vapor deposition is preferably carried out in a suitable chamber. Examples of suitable thermal CVD and plasma-enhanced CVD chambers are discussed above. Deposition may also be carried out in batch furnace reactors as well. The element or precursor thereof may be supplied to the chamber alone or in admixture with another element or elemental source and an ultra-high purity carrier gas (particularly for single wafer reactors). Examples of silicon sources include silane, disilane, and trisilane, preferably trisilane. Examples of germanium sources include germane and digermane. Examples of carbon sources include alkanes (e.g., methane, ethane, propane, etc.), alkenes (e.g., ethylene, propylene, etc.), and carbon sources that are sources of other elements as well, such as methylsilanes and silylmethanes. Examples of suitable dopant precursors include arsine, phosphine, diborane, decaborane, and stibine. Thermal chemical vapor deposition of the amorphous layer is preferably conducted at a temperature of about 575° C. or less, more preferably about 525° C. or less. For amorphous layers comprising silicon and germanium, thermal CVD is preferably conducted at a temperature of about 525° C. or less. Generally, the lowest deposition temperature that produces acceptable deposition rates for the process in question is preferable.

For the embodiments illustrated in FIGS. 1 and 2, the crystallization of the amorphous layer to form an epitaxial layer at steps 120 and 225 may be carried out in a similar fashion, and thus the following discussion is applicable to both embodiments. Preferably, crystallization is a form of solid phase epitaxy in which the crystal structure of the resulting epitaxial layer is patterned on the crystal structure of the underlying single crystal substrate. Crystallization is preferably conducted by heating the amorphous layer to a temperature of about 500° C. or greater, more preferably about 550° C. or greater, for a period of time sufficient to completely crystallize the film. Those skilled in the art will appreciate that crystallization conditions may vary, depending on various considerations such as amorphous layer composition, thermal budget, manufacturing throughput, etc., and thus routine experimentation may be used to identify crystallization conditions (e.g., time, temperature, pressure) suitable for a particular situation.

It is surprising that the buffer layer facilitates an amorphous structure at the stage of the process during which the amorphous layer is formed (e.g., at steps 115 and 220 in FIGS. 1 and 2, respectively), yet does not prevent solid phase epitaxy at the stage of the process during which the amorphous layer crystallizes (e.g., at steps 120 and 225 in FIGS. 1 and 2, respectively). This invention is not bound by theory, but it is believed that the buffer layer dissipates through diffusion during solid phase epitaxy to such an extent that subsequent crystallization occurs. For example, in a preferred embodiment in which the single crystal substrate is Si, the buffer layer is boron, and the amorphous layer is SiGe, it is believed that the presence of boron on the single crystal Si surface prevents the amorphous SiGe layer from crystallizing during the time that the amorphous SiGe layer is being deposited onto the single crystal Si substrate. However, during solid phase epitaxy, it is believed that the boron undergoes diffusion away from the interface between the single crystal Si substrate and amorphous SiGe layer, such that the crystal structure of the single crystal Si substrate acts as a template for the subsequent crystallization of the amorphous SiGe layer to form epitaxial SiGe. Thus, for elements that diffuse away from the interface readily, such as boron, arsenic, and antimony, the buffer layer containing these elements is preferably one or several monolayers in thickness and preferably contains relatively high levels of the element, e.g., in the range of about 25 atomic percent to about 100 atomic percent, even more preferably about 100 atomic percent. For elements that diffuse away from the interface less readily, such as chlorine, fluorine, oxygen and nitrogen, the buffer layer containing these elements is preferably one monolayer or less in thickness. Such buffer layers containing elements that diffuse less readily are preferably formed by chemical reaction between the element or precursor thereof and the substrate, and thus preferably contain substrate silicon atoms and the element, such that the buffer layer comprises less than 100 atomic % of the element.

The quality of SiGe formed by solid phase epitaxy is typically higher than that of SiGe formed by direct deposition, particularly for high germanium levels (e.g., about 40 atomic % Ge or greater). Thus, in a preferred embodiment, the epitaxial SiGe is incorporated into microelectronics devices to provide improved performance.

It will be appreciated by those skilled in the art that various omissions, additions and modifications may be made to the processes described above without departing from the scope of the invention, and all such modifications and changes are intended to fall within the scope of the invention, as defined by the appended claims.

What is claimed is:

1. A method for making an epitaxial film, comprising:
   providing a single crystal substrate;
   forming an amorphous buffer layer on the single crystal substrate, the amorphous buffer layer comprising an element selected from the group consisting of boron, nitrogen, chlorine, fluorine, indium, phosphorous, arsenic and antimony;
   depositing an amorphous silicon-containing layer on the amorphous buffer layer; and
   crystallizing the amorphous silicon-containing layer to thereby form an epitaxial film.

2. The method of claim 1 in which the single crystal substrate comprises silicon.

3. The method of claim 1 in which the single crystal substrate comprises SiGe or germanium.

4. The method of claim 1 in which the amorphous buffer layer has a thickness of about one monolayer.

5. The method of claim 1 in which the amorphous buffer layer has a thickness in the range of about 3 Å to about 25 Å.

6. The method of claim 1 in which the amorphous buffer layer has a thickness in the range of about 5 Å to about 15 Å.

7. The method of claim 1 in which the amount of amorphous buffer layer formed on the surface is in the range of about $4e^{14}$ to about $2e^{15}$ atoms of buffer layer material per square centimeter of substrate surface.

8. The method of claim 1 in which the amount of the element in the amorphous buffer layer is in the range of from about 1 atomic percent to about 100 atomic percent.

9. The method of claim 1 in which the amount of the element in the amorphous buffer layer is in the range of from about 25 atomic percent to about 100 atomic percent.

10. The method of claim 1 in which the buffer layer comprises boron.

11. The method of claim 10 in which the buffer layer consists essentially of boron.

12. The method of claim 10 in which the buffer layer consists essentially of silicon-boron compounds.

13. The method of claim 10 in which the buffer layer consists essentially of boron and silicon-boron compounds.

14. The method of claim 1 in which the buffer layer comprises an element selected from the group consisting of indium, phosphorous, arsenic and antimony.

15. The method of claim 1 in which the forming of the buffer layer comprises depositing the element by chemical vapor deposition.

16. The method of claim 15 in which the chemical vapor deposition is plasma enhanced.

17. The method of claim 1 in which the forming of the buffer layer comprises depositing the element by thermal chemical vapor deposition.

18. The method of claim 1 in which the depositing of the amorphous silicon-containing layer is conducted by chemical vapor deposition.

19. The method of claim 18 in which the chemical vapor deposition is thermal chemical vapor deposition.

20. The method of claim 19 in which the thermal chemical vapor deposition is conducted at a temperature of about 575° C. or less.

21. The method of claim 19 in which the thermal chemical vapor deposition is conducted at a temperature of about 525° C. or less.

22. The method of claim 18 in which the chemical vapor deposition is conducted using an elemental source selected from the group consisting of silicon source, germanium source and carbon source.

23. The method of claim 18 in which the chemical vapor deposition is conducted using a silicon source selected from the group consisting of silane, disilane, and trisilane.

24. The method of claim 23 in which the silicon source is trisilane.

25. The method of claim 1 in which the crystallizing of the amorphous silicon-containing layer is conducted by heating the amorphous silicon-containing layer.

26. A method for making an epitaxial film, comprising:

providing a single crystal substrate;

oxidizing a surface of the single crystal substrate to form a surface oxide;

reducing a portion of the surface oxide to form an oxide buffer layer;

depositing an amorphous silicon-containing layer on the oxide buffer layer; and crystallizing the amorphous silicon-containing layer to thereby form an epitaxial film.

27. The method of claim 26 in which the single crystal substrate comprises silicon.

28. The method of claim 26 in which the reducing of the surface oxide comprises exposing the surface oxide to hydrogen at a temperature of about 700° C. or greater.

29. The method of claim 26 in which the depositing of the amorphous silicon-containing layer is conducted by chemical vapor deposition.

30. The method of claim 29 in which the chemical vapor deposition is thermal chemical vapor deposition.

31. The method of claim 30 in which the thermal chemical vapor deposition is conducted at a temperature of about 575° C. or less.

32. The method of claim 30 in which the thermal chemical vapor deposition is conducted at a temperature of about 525° C. or less.

33. The method of claim 29 in which the chemical vapor deposition is conducted using a elemental source selected from the group consisting of silicon source, germanium source and carbon source.

34. The method of claim 29 in which the chemical vapor deposition is conducted using a silicon source selected from the group consisting of silane, disilane, and trisilane.

35. The method of claim 34 in which the silicon source is trisilane.

36. The method of claim 26 in which the crystallizing of the amorphous silicon-containing layer is conducted by heating the amorphous silicon-containing layer.

* * * * *

UNITED STATES PATENT AND TRADEMARK OFFICE
CERTIFICATE OF CORRECTION

PATENT NO. : 7,029,995 B2　　　　　　　　　　　　　　　　　　　　Page 1 of 2
APPLICATION NO. : 10/871687
DATED : April 18, 2006
INVENTOR(S) : Todd et al.

It is certified that error appears in the above-identified patent and that said Letters Patent is hereby corrected as shown below:

Box 120, Line 2, In Figure 1, delete "layer to thereby form an editaxial" and insert -- layer to thereby form an epitaxial --, therefore. As shown in attached.

In Column 8, Line 37, delete "a" and insert -- an --, therefore.

Signed and Sealed this

Eleventh Day of September, 2007

JON W. DUDAS
*Director of the United States Patent and Trademark Office*